(12) United States Patent
Furuya

(10) Patent No.: US 10,837,101 B2
(45) Date of Patent: Nov. 17, 2020

(54) FERROMAGNETIC MATERIAL SPUTTERING TARGET

(71) Applicant: JX Nippon Mining & Metals Corporation, Tokyo (JP)

(72) Inventor: Yuki Furuya, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 172 days.

(21) Appl. No.: 16/089,454

(22) PCT Filed: Mar. 23, 2017

(86) PCT No.: PCT/JP2017/011767
§ 371 (c)(1),
(2) Date: Sep. 28, 2018

(87) PCT Pub. No.: WO2017/170138
PCT Pub. Date: Oct. 5, 2017

(65) Prior Publication Data
US 2019/0106783 A1    Apr. 11, 2019

(30) Foreign Application Priority Data

Mar. 31, 2016  (JP) ................... 2016-072148

(51) Int. Cl.
| | |
|---|---|
| *C23C 14/34* | (2006.01) |
| *C22C 19/07* | (2006.01) |
| *C23C 14/35* | (2006.01) |
| *C23C 14/06* | (2006.01) |

(52) U.S. Cl.
CPC .......... *C23C 14/3414* (2013.01); *C22C 19/07* (2013.01); *C23C 14/0688* (2013.01); *C23C 14/35* (2013.01)

(58) Field of Classification Search
CPC .. C23C 14/3414; C22C 19/07; H01J 37/3414; H01J 37/3426; H01J 37/3429
USPC .................................. 204/298.12, 298.13
See application file for complete search history.

(56) References Cited

U.S. PATENT DOCUMENTS

| | | |
|---|---|---|
| 7,909,949 B2 | 3/2011 | Nakamura et al. |
| 8,568,576 B2 | 10/2013 | Sato |
| 8,663,402 B2 | 3/2014 | Nakamura et al. |
| 8,932,444 B2 | 1/2015 | Sato |
| 8,936,707 B2 | 1/2015 | Sato |
| 9,034,153 B2 | 5/2015 | Satoh |
| 9,034,155 B2 | 5/2015 | Sato et al. |

(Continued)

FOREIGN PATENT DOCUMENTS

| | | |
|---|---|---|
| JP | 2008-223072 A | 9/2008 |
| JP | 2011-208169 A | 10/2011 |
| WO | 2014/125897 A1 | 8/2014 |

*Primary Examiner* — Rodney G McDonald
(74) *Attorney, Agent, or Firm* — Howson & Howson LLP

(57) ABSTRACT

Provided is an oxide grain-dispersed ferromagnetic material sputtering target having a fine structure which can effectively reduce abnormal discharge and generation of particles caused by oxide grains. A sintered sputtering target contains, as metal or an alloy, 0 mol % or more and 45 mol % or less of Pt, 55 mol % or more and 95 mol % or less of Co, and 0 mol % or more and 40 mol % or less of Cr; and further contains at least two kinds of oxides. The oxides are present in the metal or alloy, and the standard deviation of the number density of oxides is 2.5 or less.

8 Claims, 2 Drawing Sheets

(56) References Cited

U.S. PATENT DOCUMENTS

| | | |
|---|---|---|
| 9,103,023 B2 | 8/2015 | Sato |
| 9,181,617 B2 | 11/2015 | Ogino et al. |
| 9,567,665 B2 | 2/2017 | Takami et al. |
| 9,761,422 B2 | 9/2017 | Arakawa et al. |
| 9,793,099 B2 | 10/2017 | Ogino et al. |
| 2009/0242393 A1* | 10/2009 | Satoh .................. G11B 5/851 204/298.13 |
| 2012/0241317 A1 | 9/2012 | Ikeda et al. |
| 2012/0273347 A1 | 11/2012 | Koide |
| 2013/0175167 A1 | 7/2013 | Ikeda et al. |
| 2013/0213802 A1 | 8/2013 | Sato et al. |
| 2013/0248362 A1 | 9/2013 | Ogino et al. |
| 2014/0001038 A1 | 1/2014 | Ogino et al. |
| 2014/0311899 A1 | 10/2014 | Ikeda |
| 2014/0311902 A1* | 10/2014 | Ogino .................. C22C 38/002 204/298.13 |
| 2014/0367254 A1 | 12/2014 | Sato et al. |

* cited by examiner

FERROMAGNETIC MATERIAL SPUTTERING TARGET

BACKGROUND

The present invention relates to a magnetic material sputtering target used for the formation of magnetic thin films for use in recording layers etc. of magnetic recording media, particularly granular films of magnetic recording media of hard disks employing a perpendicular magnetic recording system. Specifically, the present invention relates to a sintered sputtering target comprising a non-magnetic material grain-dispersed magnetic material in which the dispersion properties of oxides in the target are improved so as to suppress abnormal discharge and prevent generation of particles during sputtering, and it also relates to a method for producing the same.

In magnetic recording media, such as hard disks, layers obtained by forming a thin film of a magnetic material on a substrate such as glass are used as magnetic recording layers. For the formation of such magnetic recording layers, a magnetron sputtering method using a direct current (DC) power source is widely used because of its high productivity. The magnetron sputtering method is a method that can increase the film formation rate. In the method, a magnet is placed on the back of a target, and magnetic flux is leaked to the target surface so that charged grains in the discharge plasma are constrained by magnetic flux due to the Lorentz force, and high-density plasma can be concentrated in the vicinity the target surface.

In the field of magnetic recording represented by hard disk drives, materials based on Co, Fe, or Ni, all of which are ferromagnetic metal, are used as materials for magnetic thin films serving as magnetic recording layers that are responsible for recording. For example, in recording layers of hard disks employing an in-plane magnetic recording system in which the magnetization direction of a magnetic material is parallel to the recording surface, Co—Cr-based or Co—Cr—Pt-based ferromagnetic alloys containing Co as a main component have been conventionally used.

In contrast, a perpendicular magnetic recording system in which the magnetic recording amount per recording area is densified by making the magnetization direction of a magnetic material perpendicular to the recording surface has been put in practical use. This system is the recent main stream. In magnetic recording layers of hard disks employing the perpendicular magnetic recording system, composite materials comprising a Co—Cr—Pt-based ferromagnetic alloy composed of Co as a main component and a non-magnetic inorganic material are often used. Magnetic thin films of magnetic recording media, such as hard disks, are often produced by sputtering magnetic material sputtering targets composed of the above materials in terms of high productivity.

Available methods for producing such magnetic material sputtering targets include a dissolution method and a powder metallurgy method. Which method is used to produce sputtering targets depends on the required sputtering characteristics and thin film performance, and thus cannot be generally determined. However, sputtering targets used in the production of recording layers of hard disks in the perpendicular magnetic recording system described above, which is the recent main stream, are generally produced by the powder metallurgy method. The reason for this is that for sputtering targets for use in the formation of perpendicular magnetic recording-type recording layers, it is necessary to uniformly disperse inorganic grains in an alloy base, and it is difficult to realize such a structure by the dissolution method.

Regarding the production of sputtering targets from composite material by the foregoing powder metallurgy method, sputtering targets composed of a composite material comprising a ferromagnetic alloy and a non-magnetic inorganic material have been proposed so far, and approaches have been attempted to improve them from several viewpoints. For example, Patent Documents 1 and 2 disclose sintered sputtering targets in which oxide grains are dispersed in an alloy base by the powder metallurgy method. It is described that the permeability as the entire target is reduced and magnetic flux (Path Through Flux: PTF) passing up to the sputtering surface of the magnetic material target can be increased by making an alloy of specific elemental composition present in an alloy base as coarse grains, and that the film formation rate can be improved by increasing the plasma density in the vicinity of the sputtering surface.

The foregoing prior art techniques are effective in terms of increasing PTF and improving productivity accordingly, and it seems that from the viewpoint of preventing the generation of particles, a certain degree of consideration has been taken regarding the micro-structure of the target. However, the presence of the alloy of specific composition as coarse grains in the alloy base of the sputtering target simultaneously means that composition unevenness is locally present in the alloy base of the target. Thus there was a concern that the uniformity of the composition of a thin film obtained by sputtering such a target would be affected not a small extent.

As an approach from a viewpoint different from these prior art techniques, Patent Documents 3 and 4 disclose sintered sputtering targets obtained by dispersing oxide grains in an alloy base, followed by sintering, using the powder metallurgy method. According to the disclosed techniques, fine and uniform micro-structures are obtained by controlling the shape and dispersed form of oxides dispersed in the targets. With these targets, the oxide as a dispersing element is an insulator, so the oxide can be a cause of abnormal discharge depending on the shape and dispersed form. In addition, there was a problem in that abnormal discharge, drop-outs of the oxide, etc., caused generation of particles during sputtering. These prior art techniques can be said that they have focused on suppressing abnormal discharge and preventing the generation of particles during sputtering by making the micro-structure of the sputtering target fine and uniform.

Patent Document 3 discloses a specific example in which one kind of oxide is dispersed in a target alloy base; and Patent Document 4 discloses a sintered sputtering target obtained by dispersing several oxides in a predetermined form in an alloy base. However, in these prior art techniques, there is also room for further improvement in the present form and dispersed form of the oxides in the targets. There has been a demand for sputtering targets that can more effectively suppress abnormal discharge and prevent generation of particles.

In particular, since the perpendicular recording system has become the main stream, the floating amount of the magnetic head in magnetic recording devices, such as hard disk drives, has decreased every year, along with improved recording density. Accordingly, requirements for the size and number of particles allowable on magnetic recording media are becoming increasingly severe. Most of particles formed during the formation of granular films are known to be oxides originated from the target; thus, as a method for suppressing such generation of particles, it is considered very effective to disperse the oxides in the target more finely and uniformly in the alloy base.

CITATION LIST

Patent Documents

Patent Document 1: Japanese Patent No. 5375707
Patent Document 2: WO2014/125897
Patent Document 3: Japanese Patent No. 4975647
Patent Document 4: WO2013/125469

SUMMARY

In the light of the above problems, an object of the present invention is to provide a non-magnetic material grain-dispersed magnetic material sintered sputtering target that can effectively reduce abnormal discharge and generation of particles caused by oxides in the sputtering target, and to also provide a method for producing the same.

In order to solve the above problems, the present inventor conducted extensive research and consequently found that abnormal discharge caused by oxides during sputtering can be suppressed by adjusting the structure of the target, particularly the dispersed form of oxide grains, and controlling the grains to have a specific structure as detailed below.

Based on the findings, the present invention provides the following aspects.

1) A sintered sputtering target containing, as metal or an alloy, 0 mol % or more and 45 mol % or less of Pt, 55 mol % or more and 95 mol % or less of Co, 0 mol % or more and 40 mol % or less of Cr, and further containing at least two kinds of oxides; in which the oxides are present in the metal or alloy, and the standard deviation of the number density of oxides is 2.5 or less.

2) The sintered sputtering target according to 1) above wherein the oxides are elements selected from the group consisting of Cr, Ta, Ti, Si, Zr, Al, Nb, B, and Co; and the total volume ratio of the oxides relative to the entire target is 5 vol % or more and 50 vol % or less.

3) The sintered sputtering target according to 1) or 2) above, wherein the oxides are three types of $TiO_2$, $SiO_2$, and CoO, or two types of $TiO_2$ and $SiO_2$.

4) The sintered sputtering target according to any one of the 1) to 3) above, wherein one or more members selected from the group consisting of B, N, Ti, V, Mn, Zr, Nb, Ru, Mo, Ta, W, Si, and Al are contained as one or more additional element components at more than 0 mol % and 10 mol % or less.

5) A method for producing the sintered sputtering target according to any one of 1) to 4) above, the method comprising using a metal component raw material powder and an oxide component raw material powder which has been subjected to heat treatment at the time of sintering.

6) The method for producing the sintered sputtering target according to 5) above, wherein the heat treatment is performed in atmospheric air at 700° C. or more and 1900° C. or less.

According to the present invention, a ferromagnetic material sintered sputtering target of a non-magnetic material grain-dispersed type can improve characteristics regarding suppression of abnormal discharge caused by oxides and reduction of generation of particles during sputtering more considerably than before. This will demonstrate an excellent cost improvement effect by further improving yields.

DETAILED DESCRIPTION

Figure 1:
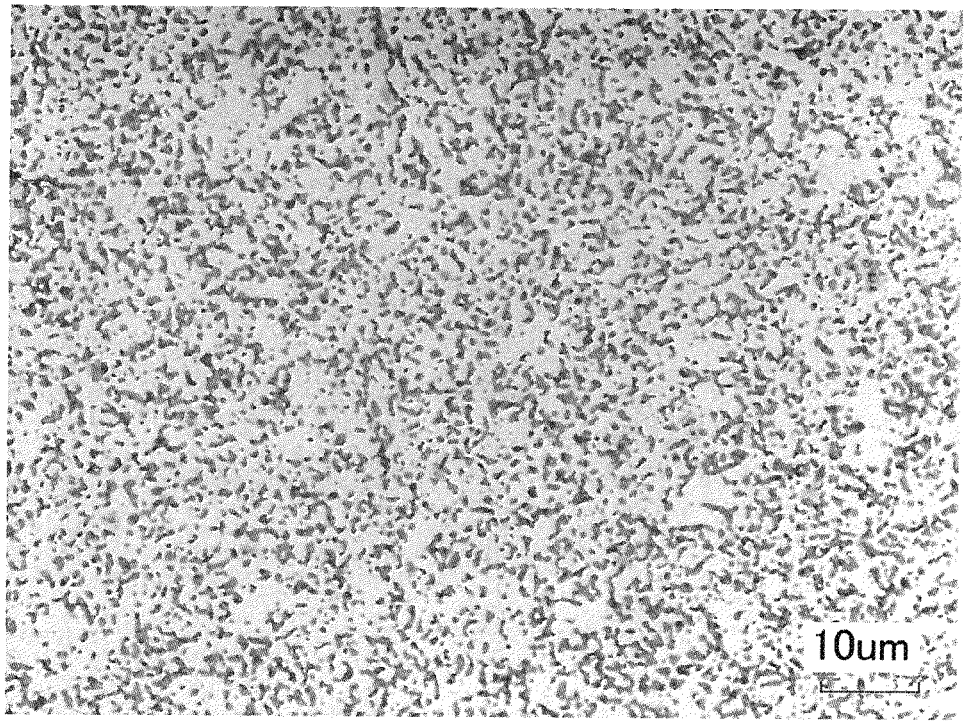
FIG. 1 shows a structure image observed with a laser microscope in Example 1 of the present invention.

The sintered sputtering target of the present invention comprises at least Co in an amount of 55 mol % or more and 95 mol % or less as an essential metal component that constitutes a target base (matrix) portion, and optionally comprises Pt and/or Cr as an optional component. Although the composition is mainly determined by magnetic performance required for magnetic recording layers, the lower limit of the Co composition is 55 mol %, and preferably 60 mol % or more. In contrast, the upper limit of the Co composition is 95 mol %, preferably 85 mol % or less, and more preferably 75 mol % or less. When the Co amount falls outside the upper and lower limits, magnetization properties generally required as perpendicular magnetic recording-type magnetic recording layers cannot be obtained.

The lower limit of the Pt composition is preferably 1 mol %, and more preferably 5 mol % or more. The upper limit of the Pt composition is 45 mol %, and preferably 25 mol % or less. Although it depends on the composition of other elements, magnetization properties required as perpendicular magnetic recording-type magnetic recording layers cannot be obtained in many cases if the Pt composition falls outside these upper and lower limits.

Further, Cr can be contained in an amount of 40 mol % or less as a metal component that constitutes the matrix, depending on the magnetic performance of the magnetic recording layer. When the matrix metal components of the target include Cr, the range of the Cr composition is preferably 20 mol % or less, and more preferably 10 mol % or less.

The sputtering target according to the embodiment of the present invention, two or more oxides are finely dispersed in a matrix composed mainly of the above metal components. The oxides mentioned here refer to both a single element oxide and a composite oxide; however, the oxides contained in the present invention are at least two kinds of oxides. This is because grain growth occurs when two or more oxide powders as raw materials for sintered bodies are heat-treated in advance, and the surface energy of the raw material oxide powders is thereby reduced to suppress excessive grain growth during sintering. This is meant to exert a function effect that the degree of aggregation and uneven distribution of the oxides in the sintered body can be reduced.

The sintered sputtering target of the present invention is such that oxides are finely dispersed in a matrix composed mainly of metal components. It is obvious from the findings of the prior art that the micro-structure of the target is deeply involved in abnormal discharge and generation of particles during sputtering. Sputtering is a phenomenon generated by the interaction between charged particles (ions) entering the target surface at the atomic/molecular level, and solid atoms that constitute the target surface. Thus, the behavior etc. of glow discharge that generates sputtering varies depending on the difference in the atomic species of the solid atoms that constitute the surface of the target, and in the arrangement configuration of the atomic group.

When DC sputtering is performed using a sputtering target having a structure in which insulating oxide components are dispersed in a matrix composed mainly of the conductive metal components, incident ions cannot microscopically undergo charge recombination in the insulating oxide portion. In some cases, local charge storage (charge-up) occurs, making the potential distribution state of the target surface unstable. Then, abnormal discharge such as sudden arc discharge occurs, and substances themselves in the target or redeposited films and the like will be deposited around the target and dropped out as coarse grains, which will cause generation of particles.

Accordingly, in order to suppress abnormal discharge, such as arcing, and to prevent generation of particles as much as possible, it is technically important to appropriately evaluate the dispersed form of the insulating oxide components dispersed in the matrix composed mainly of the conductive metal components. and to control it within an appropriate range. The present invention has achieved a technically novel finding that generation of particles due to abnormal discharge can be effectively reduced in such a manner that, as a means for evaluating the dispersion state of oxides mentioned above, the average number of oxide grains per unit area (referred to as "the number density of oxides"), excluding oxide grains having a major axis of 1 μm or less, in laser microscope observation structure images in ten points extracted on the surface is taken as 100, the number density of oxides is standardized in each observation position, and the dispersed form of the oxides is adjusted so that the standard deviation of the standardized number density of oxides is within a range of 2.5 or less.

Figure 2:
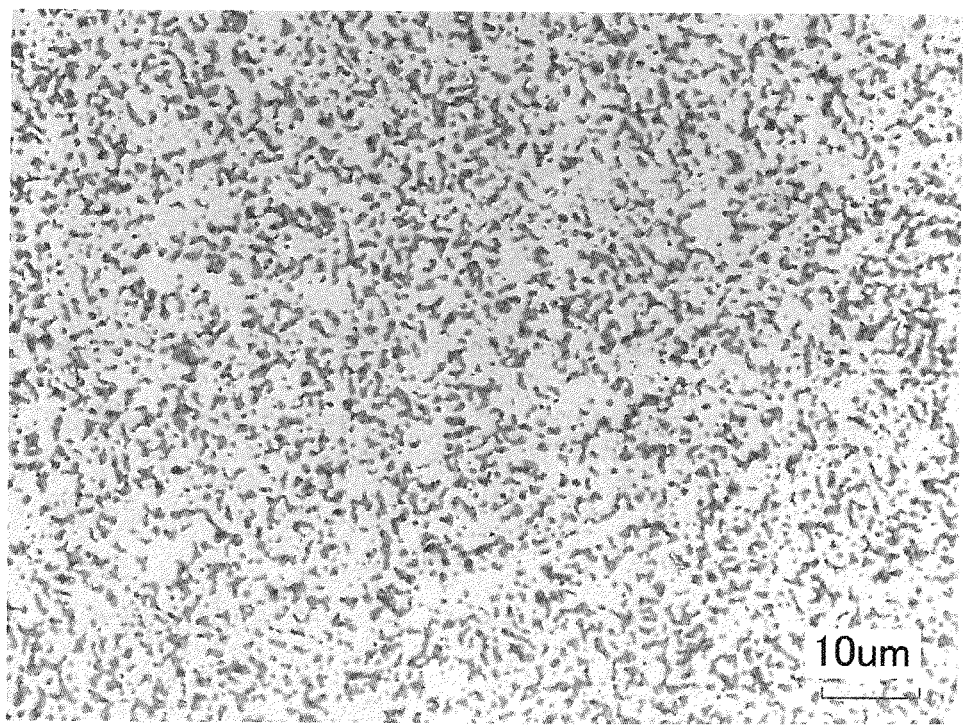
FIG. 2 shows a structure image observed with a laser microscope in Example 2 of the present invention.
Figure 3:
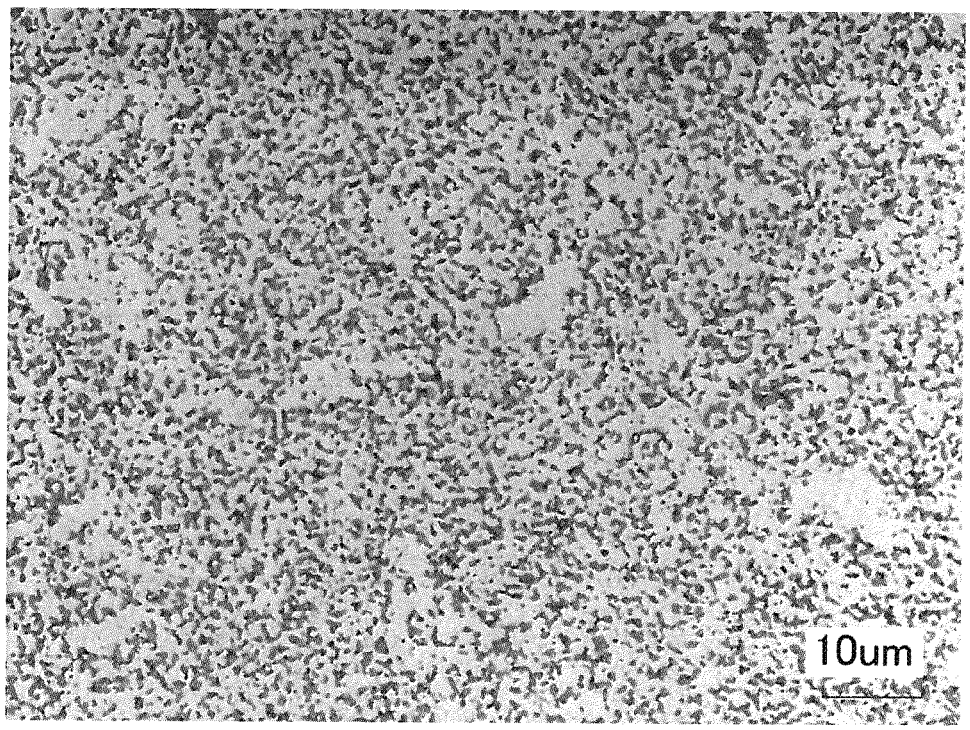
FIG. 3 shows a structure image observed with a laser microscope in Comparative Example 1 of the present invention.
Figure 4:
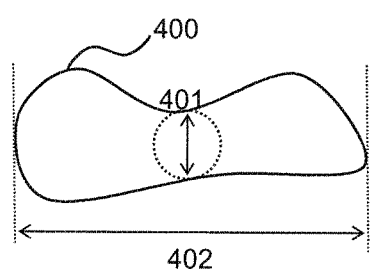
FIG. 4 illustrates the definition of the major axis and minor axis of an oxide grain in embodiments of the present invention.

The micro-structure of the target surface can be evaluated using enlarged images obtained with a laser microscope. FIGS. 1 to 3 show examples of images of the microstructures of the target surfaces of Examples and Comparative Examples, described later, observed with a laser microscope. In the laser microscope images of the targets in which oxides are dispersed in a matrix composed mainly of metal components, the boundary between the matrix portion and the oxide portion can be clearly identified by the contrast difference between them. As shown in FIG. 4, in an oxide portion 400 surrounded by the boundary, the distance obtained by connecting the furthest two points on the border line serving as the boundary by a straight line is defined as the major axis 402 of the oxide grain. Meanwhile, the diameter of the maximum circle housed inside the border line serving as the boundary is defined as the minor axis 401.

Figure 5:
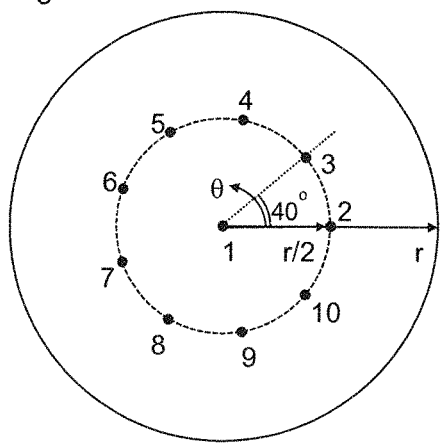
FIG. 5 illustrates respective positions to observe target structure in embodiments of the present invention.

FIG. 5 shows positions to observe structures with a laser microscope. When the radius of the target is r, observation is carried out at a total of ten points, including the target center position and nine points uniformly divided in the circumferential direction (at an interval of 40°) on the halfway point (r/2) between the center and the outer periphery in the radial direction, and laser microscope images are photographed in these observation points. The target center portion is a measurement point representing the entire target; namely, in the positions r/2, plasma is trapped and focused in the discharge of a general magnetron sputtering system, and these positions on the target often most contribute to sputtering. Thus, evaluation is performed in these positions. It should be noted that in order to precisely evaluate the dispersion state of oxide grains in an observation visual field sufficiently broader than the major axis of the oxide, observation is carried out in a visual field of 72 μm×96 μm=6912 μm². However, the visual field is not limited to this range, as long as the dispersion state of oxide grains can be precisely evaluated.

Next, the structure images of the extracted 10 samples are converted to binarized images. The threshold for binarization is set in the color tone difference on the boundary between the matrix and the oxide grains. In a laser microscope image in which oxide grains are dispersed in a metal matrix, the color tone difference on the boundary between them is generally clear; however, in some cases, the separation accuracy of both structures may be increased by the combined use of such as a discriminant analysis method and a differential histogram method. Then, the number of oxide grains in each visual field in the binarized image is counted while excluding oxide grains having a major axis of 1 μm or less, and the number of oxide grains per unit area, that is, the number density of oxides, is calculated. With the average number density of oxides in the ten structure images taken as 100, the number density of oxides in each visual field is standardized, and standard deviation is determined using the standardized number density of oxides as a sample. The standard deviation of the sputtering target of the present invention is supposed to be 2.5 or less.

The above standard deviation needs to be 2.5 or less, in terms of preventing abnormal discharge and generation of particles. Moreover, in order to obtain more preferable discharge characteristics, the above standard deviation is preferably 2.4 or less, and more preferably 2.0 or less.

The oxide components dispersed in the sputtering target are preferably more than two oxides selected from the group consisting of Cr, Ta, Ti Si, Zr, Al, Nb, B, and Co, used for the magnetic performance of magnetic films, particularly perpendicular magnetic recording-type recording layers. Moreover, the total volume ratio of the oxides relative to the entire target is preferably 5 vol % or more and 50 vol % or less. If the total volume ratio of the oxides relative to the entire target is less than 5 vol %, it is difficult to form magnetic films that can exhibit desired magnetic properties in Co—Pt-based or Co—Cr—Pt-based ferromagnetic materials. In contrast, if the volume ratio exceeds 50 vol %, there is a higher tendency that the oxides form aggregates in the target, so that it is difficult to uniformly and finely disperse the oxides. The total volume ratio of the oxides relative to the entire target is preferably 5 vol % or more, and more preferably 20 vol % or more. In order to achieve the effect of preventing oxide aggregation described above, the volume ratio of the oxides relative to the entire target is preferably 40 vol % or less, and more preferably 30 vol % or less.

It is practically difficult to evaluate the volume ratio of only a specific structure in the target after sintering. Accordingly, the volume ratio of the oxides relative to the entire target of the present invention is evaluated as a value corresponding to the area ratio of the oxide portion in the entire observation visual field in the above image observed with a laser microscope. The area ratio can be evaluated by calculating the ratio of the oxide portion and the matrix portion in the above binarized image using data based on the number of pixels in each corresponding portion. The area ratio of the oxide portion in the entire observation visual field is actually the ratio of the area of oxide grains accounting in the two-dimensional plane, but is not the volume ratio in the three-dimensional space. However, when it is premised that grains are isotopically dispersed in all directions, the area ratio in the two-dimensional plane can be regarded as the volume ratio in the three-dimensional space. It has been confirmed that when the dispersed form of the present invention is achieved, the area ratio of the oxide portion evaluated from the observation image is not greatly different from the volume ratio of the oxides relative to all of the raw materials evaluated from the weight and density of the raw materials. A laser microscope is used in the present invention; and it is also possible to use an electron microscope or the like which has the same function.

The oxide components dispersed in the sputtering target are preferably three types of $TiO_2$, $SiO_2$, and CoO, or two types of $TiO_2$ and $SiO_2$, from a practical viewpoint.

Furthermore, the sputtering target of the present invention can contain one or more members selected from the group consisting of B, N Ti, V, Mn, Zr, Nb, Ru, Mo, Ta, W, Si, and Al in an amount of 10 mol % or less as one or more additional element components. These elements are optionally added in order to improve the magnetic properties of magnetic films as recording layers of magnetic recording media. The amount of these elements to be added is an effective amount for exhibiting the effect of addition, and is within a range that does not adversely affect the magnetic properties of the magnetic film.

The sputtering target of the present invention described so far contributes to solve the technical problems to suppress abnormal discharge and prevent generation of particles during sputtering, as long as it has the above characteristics, regardless of the production method and production conditions. As a means for effectively producing the sputtering target according to the embodiment of the present invention, a method for producing a sputtering target is provided is described below.

The sputtering target of the present invention can be produced using a sintered body obtained by the powder metallurgy method. For the sintered body, raw material powders of metal components and oxide components are first prepared. All the raw material powders are weighed so that, when a sintered body is formed, the composition in the entire sintered body is as follows: 0 mol % or more and 45 mol % or less of Pt, 55 mol % or more and 95 mol % or less of Co, and 0 mol % or more and 40 mol % or less of Cr. As the metal components, alloy powders that satisfy the above composition range may be used as raw material powders, rather than raw material powders composed of a single element metal. The oxide raw material powders may be single element oxide powders or composite oxide powders; however, it is necessary to use two or more different oxides. When an additional element is further added, a required amount of the raw material powder thereof is similarly weighed.

These raw material powders preferably have a maximum grain diameter of 20 μm or less. In order to obtain a uniform and fine micro-structure of a sintered body, it is more preferable to use raw material powders having a maximum grain diameter of 10 μm or less. In contrast, if the raw material grain diameter is overly small, there are problems that oxidation of the metal powders is promoted, so that the component composition may be departed from the design composition of the sintered body; and that the oxide powders are aggregated in the mixing step. Thus, the raw material grain diameter is preferably 0.1 μm or more.

Next, pre-heat treatment is performed on only the oxide raw material powders among the raw material powders. It is necessary to perform pre-heat treatment, which is applied to the oxide raw material powders, on a powder mixture in which two or more oxides are mixed. When three or more oxide raw material powders are used, at least two of the three or more oxide raw material powders may be mixed, and pre-heat treatment may be performed on the mixed powder mixture; however, on which oxide pre-heat treatment is performed may be determined in the light of the characteristics of the oxides used.

Because pre-heat treatment is performed on the mixture of two oxide raw material powders, the micro-structure of the sintered body obtained after sintering is significantly changed, and the micro-structure of the sputtering target of the present invention can be more easily obtained, compared with when pre-heat treatment is not performed. The reason that the micro-structure of the sintered body after sintering is changed due to pre-heat treatment is not necessarily clarified at this time; however, one reason for this can be presumed as follows. Grain growth occurs when heat treatment is performed on a mixture of two oxides, and the surface energy of the raw material oxide powders is thereby reduced to suppress excessive grain growth during sintering. As a result, the degree of aggregation and uneven distribution of the oxides in the sintered body is reduced.

The conditions of pre-heat treatment performed on the oxide raw material powders may be determined while suitably adjusting them within a range in which the above function effect can be obtained. Preferable conditions for obtaining the target of the present invention include atmospheric air at ordinary pressure at a temperature of 700° C. or more and 1900° C. or less for 1 hour or more.

The weighed raw material powders are mixed and pulverized using a known means, such as a ball mill. When an oxide powder that has not been subjected to pre-heat treatment is present, in addition to the metal component raw material powders and the pre-heated oxide component raw material powders, this oxide powder is added and mixed in this stage. When an additional element is added, a raw material powder of an element is simultaneously mixed in this stage. The mixer can be a planetary-motion mixer, a planetary-motion stirring mixer, or the like. In consideration of the problem of oxidation of the metal components during mixing, it is preferable to perform mixing in an inert gas atmosphere or under vacuum.

Next, the powder mixture in which all the raw material powders are uniformly mixed and pulverized is filled in a predetermined mold, and hot-pressed to form a sintered body. Hot-pressing can be performed under general conditions. The obtained sintered body is subjected to final processing on the surface and shape to obtain the sputtering target of the present invention.

EXAMPLES

Embodiments of the present invention are now described in detail based on Examples and Comparative Examples. The following descriptions of the Examples and Comparative Examples merely show specific examples for facilitating the understanding of the technical contents of the present invention, and the technical scope of the present invention is not limited thereby.

Example 1

As metal component raw material powders, a Co powder having an average grain diameter of 3 μm and a Pt powder having an average grain diameter of 3 μm; and as oxide component raw material powders, a $TiO_2$ powder having an average grain diameter of 1 μm, a $SiO_2$ powder having an average grain diameter of 1 μm, and a CoO powder having an average grain diameter of 1 μm were prepared. These powders were weighed at a certain molar ratio. The composition is as follows.

Composition: 80Co-5Pt-5TiO₂-5SiO₂-5CoO (mol %)

Next, the three oxide powders, i.e., TiO₂ powder, SiO₂ powder, and CoO powder, which were oxide component raw material powders, were mixed, and pre-heat treatment was performed on the resulting powder mixture. The pre-heat treatment was performed in atmospheric air at ordinary pressure at 1050° C. for 300 minutes. The oxide raw material powder mixture after the completion of pre-heat treatment was cooled down to room temperature by furnace cooling, and then subjected to the subsequent step.

The oxide component raw material powder mixture, which had been subjected to the above pre-heat treatment, and the metal component raw material powders were mixed and pulverized for 10 minutes using a planetary-motion mixer having a ball capacity of about 7 liters. Then, the raw material powder mixture was sealed in a 10-liter ball mill pot, together with TiO₂ balls as pulverization media, and mixed by rotation for 20 hours. The powder mixture was filled in a carbon mold, and hot-pressed in a vacuum atmosphere at a temperature of 850° C. for a retention time of 2 hours at a pressure of 30 MPa to obtain a sintered body. Further, the sintered body was cut to obtain a circular sputtering target having a diameter of 165.1 mm and a thickness of 5 mm.

The surface of the obtained sputtering target was polished, and the micro-structure was observed with a laser microscope. FIG. 1 shows the obtained structure image. The black portions observed in the figure correspond to the oxide components, and the white portions surrounding the black portions correspond to the metal components. This figure reveals that the oxide dispersion is uniformly dispersed while forming very small aggregates, without being locally and unevenly distributed or without forming coarse aggregates. In this example, the standard deviation of the standardized number density of oxides is 1.8, which satisfies the range of the present invention. Table 1 shows the number of grains measured in each measurement point.

Example 2

The preparation and weighing of raw material powders were performed in the same manner as in Example 1, and the composition was also the same as that of Example 1.

In Example 2, two (i.e., TiO₂ powder and SiO₂ powder) of the three oxide component raw material powders, i.e., TiO₂ powder, SiO₂ powder, and CoO powder, were mixed, and pre-heat treatment was performed on the resulting powder mixture. The pre-heat treatment was performed in atmospheric air at ordinary pressure at 1050° C. for 300 minutes. The oxide raw material powder mixture after the completion of pre-heat treatment was once cooled to room temperature by furnace cooling, and then was subjected to the subsequent step.

The oxide component raw material powder mixture, which had been subjected to the above pre-heat treatment, and the metal component raw material powders, which had not been subjected to heat treatment, were mixed and pulverized for 10 minutes using a planetary-motion mixer having a ball capacity of about 7 liters. Then, the raw material powder mixture was sealed in a 10-liter ball mill pot, together with TiO₂ balls as pulverization media, and mixed by rotation for 20 hours. The powder mixture was filled in a carbon mold, and hot-pressed in a vacuum atmosphere at a temperature of 850° C. for a retention time of 2 hours at a pressure of 30 MPa to obtain a sintered body. Further, the sintered body was cut to obtain a circular sputtering target having a diameter of 165.1 mm and a thickness of 5 mm.

The surface of the obtained sputtering target was polished, and the micro-structure was observed with a laser microscope. FIG. 2 shows the obtained structure image. In Example 2, it is also revealed that the oxide dispersion is uniformly dispersed while forming very small aggregates, without being locally and unevenly distributed or without forming coarse aggregates. In this example, the standard deviation of the standardized number density of oxides is 2.3, which satisfies the range of the present invention. Table 1 also shows the number of grains measured in each measurement point.

TABLE 1

|  | Composition | Number of grains measured Measurement position (r, q) | | | | | | | | | |
|---|---|---|---|---|---|---|---|---|---|---|---|
|  |  | (0, 0) | (r/2, 0) | (r/2, 40) | (r/2, 80) | (r/2, 120) | (r/2, 160) | (r/2, 200) | (r/2, 240) | (r/2, 280) | (r/2, 320) |
| Example 1 | 80Co—5Pt—5TiO₂—5SiO₂—5CoO | 868 | 860 | 861 | 891 | 834 | 875 | 869 | 878 | 882 | 883 |
| Example 2 | 80Co—5Pt—5TiO₂—5SiO₂—5CoO | 971 | 1007 | 984 | 943 | 968 | 975 | 962 | 1004 | 950 | 943 |
| Example 3 | 50Co—10Cr—25Pt—5TiO₂—10SiO₂ | 844 | 872 | 822 | 863 | 878 | 892 | 837 | 854 | 856 | 843 |
| Comparative Example 1 | 80Co—5Pt—5TiO₂—5SiO₂—5CoO | 984 | 966 | 961 | 935 | 1007 | 932 | 939 | 947 | 942 | 1004 |
| Comparative Example 2 | 50Co—10Cr—25Pt—5TiO₂—10SiO₂ | 850 | 831 | 830 | 851 | 901 | 888 | 890 | 822 | 903 | 847 |

Further, sputtering was performed using the target placed in a DC magnetron sputtering device, and the particles were evaluated. The sputtering conditions during evaluation were as follows:

Supplied power: 1 kW,
Sputtering time: 20 seconds, and
Ar atmosphere pressure: 1.7 Pa.

Then, the number of particles attached to the substrate was counted with a particle counter. In this case, the number of particles having a diameter of 0.07 μm or more observed on the silicon substrate was 44.

Further, the target was evaluated about particles under the same conditions as in Example 1. As a result, the number of particles having a diameter of 0.07 μm or more observed on the silicon substrate was 72.

Example 3

As metal component raw material powders, a Co powder having an average grain diameter of 3 μm, a Cr powder having an average grain diameter of 3 μm, and a Pt powder having an average grain diameter of 3 μm; and as oxide component raw material powders, a $TiO_2$ powder having an average grain diameter of 1 μm and a $SiO_2$ powder having an average grain diameter of 1 μm were prepared. These powders were weighed at a certain molar ratio. The composition is as follows.

Composition: 50Co-10Cr-25Pt-5TiO$_2$-10SiO$_2$ (mol %)

Next, the two oxide powders, i.e., $TiO_2$ powder and $SiO_2$ powder, which were oxide component raw material powders, were mixed, and pre-heat treatment was performed on the resulting powder mixture. The pre-heat treatment was performed in atmospheric air at ordinary pressure at 1050° C. for 300 minutes. The oxide raw material powder mixture after the completion of pre-heat treatment was cooled down to room temperature by furnace cooling, then was subjected to the subsequent step.

The oxide component raw material powder mixture, which had been subjected to the above pre-heat treatment, and the metal component raw material powders were mixed and pulverized for 10 minutes using a planetary-motion mixer having a ball capacity of about 7 liters. Then, the raw material powder mixture was sealed in a 10-liter ball mill pot, together with $TiO_2$ balls as pulverization media, and mixed by rotation for 20 hours. The powder mixture was filled in a carbon mold, and hot-pressed in a vacuum atmosphere at a temperature of 850° C. for a retention time of 2 hours at a pressure of 30 MPa to obtain a sintered body. Further, the sintered body was cut to obtain a circular sputtering target having a diameter of 165.1 mm and a thickness of 5 mm.

The surface of the obtained sputtering target was polished, and the micro-structure was observed with a laser microscope. The standard deviation of the standardized number density of oxides was calculated in the same manner as in Examples 1 and 2. In this example, the standard deviation of the standardized number density of oxides is 2.4, which satisfies the range of the present invention. Table 1 also shows the number of grains measured in each measurement point.

Further, the target was evaluated about particles under the same conditions as in Example 1. As a result, the number of particles having a diameter of 0.07 μm or more observed on the silicon substrate was 90.

Comparative Example 1

As metal component raw material powders, a Co powder having an average grain diameter of 3 μm and a Pt powder having an average grain diameter of 3 μm d; and as oxide component raw material powders, a $TiO_2$ powder having an average grain diameter of 1 μm, a $SiO_2$ powder having an average grain diameter of 1 μm, and a CoO powder having an average grain diameter of 1 μm were prepared. The raw materials and particle diameter of these powders are the same as those of Example 1. These powders were weighed at the following molar ratio. The composition is also the same as that of Example 1, as shown below.

Composition: 80Co-5Pt-5TiO$_2$-5SiO$_2$-5CoO (mol %)

In Comparative Example 1, pre-heat treatment was not performed on the oxide component raw material powders. All the raw material powders were mixed and pulverized under the same conditions as in Example 1, and hot-pressed under the same conditions as in Example 1 to obtain a sintered body. Further, the sintered body was cut to obtain a circular sputtering target having a diameter of 165.1 mm and a thickness of 5 mm.

The surface of the obtained sputtering target was polished, and the micro-structure was observed with a laser microscope. FIG. 3 shows the obtained structure image. In the structure image of Comparative Example 1, the oxide dispersion tends to be continuously connected, compared with Examples 1 and 2, and the diameter is larger than that of the oxides observed in Examples 1 and 2. In this example, the standard deviation of the standardized number density of oxides is 2.9, which does not satisfy the range of the present invention. Table 1 also shows the number of grains measured in each measurement point.

Further, the target was evaluated about particles under the same conditions as in Examples 1 and 2. As a result, the number of particles having a diameter of 0.07 μm or more observed on the silicon substrate was 165, the number significantly increased, compared with Examples 1 and 2.

Comparative Example 2

As metal component raw material powders a Co powder having an average grain diameter of 3 μm, a Cr powder having an average grain diameter of 3 μm, and a Pt powder having an average grain diameter of 3 μm; and as oxide component raw material powders, a $TiO_2$ powder having an average grain diameter of 1 μm and a $SiO_2$ powder having an average grain diameter of 1 μm were prepared. The raw materials and grain diameter of these powders are the same as those of Example 3. These powders were weighed at the following molar ratio. The composition is the same as that of Example 3, as shown below.

Composition: 50Co-10Cr-25Pt-5TiO$_2$-10SiO$_2$ (mol %)

In Comparative Example 2, pre-heat treatment was not performed on the oxide component raw material powders. All the raw material powders were mixed and pulverized under the same conditions as in Example 3, and hot-pressed under the same conditions as in Example 3 to obtain a sintered body. Further, the sintered body was cut to obtain a circular sputtering target having a diameter of 165.1 mm and a thickness of 5 mm.

The surface of the obtained sputtering target was polished, and the micro-structure was observed with a laser microscope. The standard deviation of the standardized number density of oxides was calculated in the same manner as in Example 3. In this example, the standard deviation of the standardized number density of oxides is 3.6, which does not satisfy the range of the present invention. Table 1 also shows the number of grains measured in each measurement point.

Further, the target was evaluated about particles under the same conditions as in Example 3. As a result, the number of particles having a diameter of 0.07 μm or more observed on the silicon substrate was 188, the number significantly increased compared with Example 3. Table 2 collectively shows the standard deviation of the standardized number density of oxides in Example 1, Example 2, Example 3, Comparative Example 1, and Comparative Example 2, and the number of particles having a diameter of 0.07 μm or more.

TABLE 2

| | Standard deviation of number density of grains having a major axis of more than 1 mm | Number of particles |
|---|---|---|
| Example 1 | 1.8 | 44 |
| Example 2 | 2.3 | 72 |
| Example 3 | 2.4 | 90 |

TABLE 2-continued

| | Standard deviation of number density of grains having a major axis of more than 1 mm | Number of particles |
|---|---|---|
| Comparative Example 1 | 2.9 | 165 |
| Comparative Example 2 | 3.6 | 188 |

The present invention enables to improve the microstructure of a magnetic material sputtering target, particularly the dispersed form of oxide grains, and to suppress further abnormal discharge and prevent generation of particles during sputtering. An excellent effect that the cost improvement effect due to improved yield can be further enhanced. The present invention is useful as a magnetic material sputtering target used for the formation of magnetic thin films of magnetic recording media, particularly hard disk drive recording layers.

The invention claimed is:

1. A sintered sputtering target containing, as metal or an alloy, 0 mol % or more and 45 mol % or less of Pt, 55 mol % or more and 95 mol % or less of Co, 0 mol % or more and 40 mol % or less of Cr, and further containing at least two kinds of oxides, wherein the oxides are present in the metal or alloy, and the standard deviation of the number density of oxides having a major axis of more than 1 µm in ten points on the sputtering target surface is 2.5 or less.

2. The sintered sputtering target according to claim 1, wherein the oxides are oxides of elements selected from the group consisting of Cr, Ta, Ti, Si, Zr, Al, Nb, B, and Co; and the total volume ratio of the oxides relative to the entire target is 5 vol % or more and 50 vol % or less.

3. The sintered sputtering target according to claim 2, wherein the oxides are three types of $TiO_2$, $SiO_2$, and CoO, or two types of $TiO_2$ and $SiO_2$.

4. The sintered sputtering target according to claim 3, wherein one or more members selected from the group consisting of B, N, Ti, V, Mn, Zr, Nb, Ru, Mo, Ta, W, Si, and Al are contained as one or more additional element components at more than 0 mol % and 10 mol % or less.

5. A method for producing a sintered sputtering target according to claim 1, the method comprising using, at the time of sintering, a metal component raw material powder and an oxide component raw material powder which has been subjected to heat treatment in atmospheric air at 700° C. or more and 1900° C. or less.

6. The sintered sputtering target according to claim 1, wherein the oxides include $TiO_2$ and $SiO_2$.

7. The sintered sputtering target according to claim 1, wherein the oxides include $TiO_2$, $SiO_2$, and CoO.

8. The sintered sputtering target according to claim 1, wherein the sintered sputtering target contains one or more elements selected from the group consisting of B, N, Ti, V, Mn, Zr, Nb, Ru, Mo, Ta, W, Si, and Al at more than 0 mol % and 10 mol % or less in total.

* * * * *